(12) United States Patent
Ideno (10) Patent No.: US 9,466,465 B2
(45) Date of Patent: Oct. 11, 2016

(54) CHARGED PARTICLE BEAM DRAWING APPARATUS

(71) Applicant: NuFlare Technology, Inc., Yokohama (JP)

(72) Inventor: Keita Ideno, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/674,054

(22) Filed: Mar. 31, 2015

(65) Prior Publication Data

US 2015/0311036 A1    Oct. 29, 2015

(30) Foreign Application Priority Data

Apr. 25, 2014  (JP) ................... 2014-091558

(51) Int. Cl.
*H01J 37/20* (2006.01)
*H01J 37/317* (2006.01)

(52) U.S. Cl.
CPC ............ *H01J 37/3174* (2013.01); *H01J 37/20* (2013.01); *H01J 2237/20292* (2013.01); *H01J 2237/30438* (2013.01)

(58) Field of Classification Search
USPC ................ 250/440.11, 441.11, 442.11, 443.1
See application file for complete search history.

(56) References Cited

U.S. PATENT DOCUMENTS

2005/0139781 A1*  6/2005  Hazaki ................. G01N 23/225
                                                        250/442.11
2013/0099134 A1*  4/2013  Sun et al. ................ 250/440.11

FOREIGN PATENT DOCUMENTS

| EP | 0 878 822 B1 | 9/2002 |
| JP | 2003-017394 | 1/2003 |
| JP | 2005-19708 A | 1/2005 |

OTHER PUBLICATIONS

Office Action issued May 9, 2016, in Korean Patent Application No. 10-2015-0056409 (with English-language translation).

* cited by examiner

*Primary Examiner* — Nicole Ippolito
(74) *Attorney, Agent, or Firm* — Oblon, McClelland, Maier & Neustadt, L.L.P.

(57) ABSTRACT

A charged particle beam drawing apparatus according to an embodiment includes; a vacuum vessel including a base plate; a stage provided in the vacuum vessel and supporting a sample; a stage movement mechanism provided in the vacuum vessel and moving the stage; a two-dimensional scale provided on a lower surface of the stage; a detection unit disposed under the two-dimensional scale and detecting a position of the stage by using the two-dimensional scale; and a support body supporting the detection unit.

12 Claims, 5 Drawing Sheets

CHARGED PARTICLE BEAM DRAWING APPARATUS

CROSS-REFERENCE TO THE RELATED APPLICATION

This application is based on and claims the benefit of priority from Japanese Patent Application No. 2014-091558, filed on Apr. 25, 2014; the entire contents of which are incorporated herein by reference.

FIELD

Embodiments described herein relate generally to a charged particle beam drawing apparatus.

BACKGROUND

Along with higher integration and larger capacity of large scale integration circuits (LSI) in recent years, the circuit line width demanded for semiconductor devices has been becoming increasingly fine. The lithography technology is used to form a desired circuit pattern in a semiconductor device. In this lithography technology, pattern transfer is performed using a defined image pattern called a mask (reticle). The charged particle beam drawing apparatus having excellent resolution is used to manufacture highly accurate masks used for pattern transfer.

In a vacuum vessel, the charged particle beam drawing apparatus irradiates a predetermined position of a sample on a stage with a deflected charged particle beam and draws a pattern on the sample while moving the stage that supports the sample such as a mask or a blank. The charged particle beam drawing apparatus detects a stage position by means of a laser displacement measure provided on the lateral side of the vacuum vessel, and performs drawing control based on the detected stage position.

However, when a vacuum is created in the vacuum vessel by decompression, the vacuum vessel is slightly deformed due to the effect of the atmospheric pressure (pressure difference). In this situation, the laser displacement measure provided on the lateral side may incline due to the deformation of the lateral side of the vacuum vessel, and may fail in accurate measurement of the stage position. Thus, there is a need for avoiding reduction in the accuracy of the measurement of the stage position.

DETAILED DESCRIPTION

According to one embodiment, a charged particle beam drawing apparatus includes: a vacuum vessel including a base plate; a stage provided in the vacuum vessel and supporting a sample; a stage movement mechanism provided in the vacuum vessel and moving the stage; a two-dimensional scale provided on a lower surface of the stage; a detection unit disposed under the two-dimensional scale and detecting a position of the stage by using the two-dimensional scale; and a support body supporting the detection unit.

Various Embodiments will be described hereinafter with reference to the accompanying drawings.

(First Embodiment)

A first embodiment is described with reference to FIGS. 1 to 3.

Figure 1:
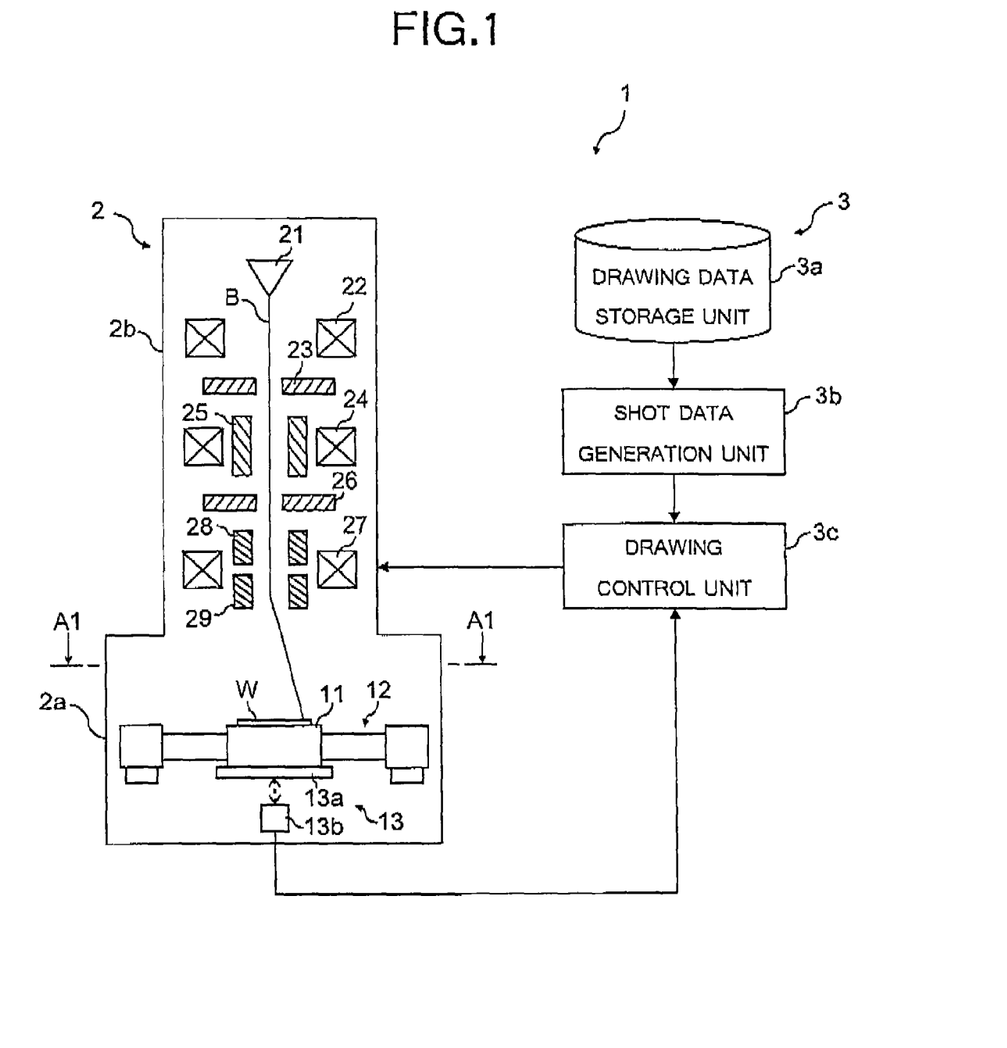
FIG. 1 is a schematic diagram illustrating a schematic configuration of a charged particle beam drawing apparatus according to a first embodiment.

As illustrated in FIG. 1, a charged particle beam drawing apparatus 1 according the first embodiment includes a drawing unit 2 that draws using a charged particle beam, and a control unit 3 that controls the drawing unit 2. The charged particle beam drawing apparatus 1 is an example of a variable-shaped beam drawing apparatus that uses, for example, an electron beam as a charged particle beam. It is to be noted that the charged particle beam is not limited to an electron beam, and may be other charged particle beam such as an ion beam.

The drawing unit 2 includes a drawing chamber 2a that is a vacuum vessel that houses a sample W on which drawing is performed, and an optical lens barrel 2b connected to the drawing chamber 2a. The drawing chamber 2a has airtightness (hermetic sealing), and functions as a vacuum chamber (decompression chamber). The optical lens barrel 2b is provided on the upper surface of the drawing chamber 2a. An electron beam is formed and deflected by an optical system and the sample W in the drawing chamber 2a is irradiated with the electron beam. At this point, the inside of both the drawing chamber 2a and the optical lens barrel 2b is decompressed to a vacuum state.

In the drawing chamber 2a, there are provided a stage 11 that supports the sample W such as a mask or a blank, a stage movement mechanism 12 that moves the stage 11, and a stage position measurement unit 13 that measures the position of the stage 11. The stage movement mechanism 12 is a mechanism that moves the stage 11 in the X-axis direction and the Y-axis direction (hereinafter simply referred to as the X direction and the Y direction) that are perpendicular to each other in a horizontal plane. The stage position measurement unit 13 is a measurement unit that measures the position of the stage 11 by detecting graduations of a two-dimensional scale 13a with an encoder head 13b, the two-dimensional scale 13a being provided on the lower surface of the stage 11 (the details will be described later).

In the optical lens barrel 2b, there are disposed an emitter 21 such as an electron gun that emits an electron beam B, an illumination lens 22 that concentrates the electron beam B, a first shaping aperture 23 for beam shaping, a projecting lens 24 for projection, a shaping deflector 25 for beam shaping, a second shaping aperture 26 for beam shaping, an objective lens 27 that forms a beam focus on the sample W, a secondary deflector 28 and a main deflector 29 for controlling the beam shot position on the sample W. In the drawing unit 2, the electron beam B is emitted from the emitter 21 to the first shaping aperture 23 via the illumination lens 22, The first shaping aperture 23 has, for example, a rectangular opening. Thus, after the electron beam B passes through the first shaping aperture 23, the cross-section of the electron beam B is shaped in a rectangular form and the electron beam B is projected on the second shaping aperture 26 via the projecting lens 24. The projection position may be deflected by the shaping deflector 25 and the shape and dimension of the electron beam B are controllable by changing the projection position. Subsequently, the electron beam B, which has passed through the second shaping aperture 26, is focused on and emitted to the sample Won the stage 11 by the objective lens 27. At this point, the shot position of the electron beam B on the sample W on the stage 11 is may be changed by the secondary deflector 28 and the main deflector 29.

The control unit 3 includes a drawing data storage unit 3a that stores drawing data, a shot data generation unit 3b that processes the drawing data to generate shot data, and a drawing control unit 3c that controls the drawing unit 2. It is to be noted that the shot data generation unit 3b and the drawing control unit 3c may be implemented by hardware such as an electric circuit, by software such as a program that performs each function, or by a combination of both hardware and software.

The drawing data storage unit 3a is a storage unit that stores drawing data for drawing a pattern on the sample W. The drawing data is data that is converted from design data (layout data) to a format for the charged particle beam drawing apparatus 1, the design data being created by a designer or the like for an integrated circuit, and the drawing data is inputted and stored into the drawing data storage unit 3a from an external device. For example, a magnetic disk drive or a semiconductor disk drive (flash memory) may be used as the drawing data storage unit 3a.

It is to be noted that the design data normally generally include a large number of fine patterns (such as figures) and thus have a considerably large data volume. If the design data is converted to another format without any special processing, the design data will have a further increased data volume after the conversion. For this reason, data volume compression is performed in the drawing data by such a method as data layering or array representations of patterns. Such drawing data specifies a drawing pattern for a chip area or a drawing pattern for a virtual chip area in which plural chip areas having the same drawing conditions are virtually merged and regarded as a single chip.

The shot data generation unit 3b divides a drawing pattern specified by the drawing data into plural stripe areas (where longitudinal direction is the X direction and transverse direction is the Y direction) each in reed shape, and further divides each stripe area into many sub areas in a matrix form. In addition, the shot data generation unit 3b determines the shape, size, and position of each of the figures in each sub area, and when it is not possible to draw the figures by a single shot, the shot data generation unit 3b divides a sub area into plural partial areas each of which may be drawn by a single shot, and generates shot data. It is to be noted that the length of each stripe area in the transverse direction (the Y direction) is set to be a length by which the electron beam B may be deflected by the main deflection.

When the above-mentioned drawing pattern is drawn, the drawing control unit 3c positions the electron beam B at each sub area by the main deflector 29 and shots the electron beam B at a predetermined position of the sub area by the secondary deflector 28 to draw a figure while moving the stage 11 in the longitudinal direction (the X direction) of the stripe area by the stage movement mechanism 12. Subsequently, when drawing of one stripe area is completed, the drawing control unit 3c moves the stage 11 by a step in the Y direction and draws a figure on the next stripe area, and repeats this process to draw a pattern on the entire drawing area of the sample W using the electron beam B (example of drawing operation). Because the stage 11 is continuously moved in one direction during the drawing, the drawing origin of the sub area is tracked by the main deflector 29 so that the drawing origin follows the movement of the stage 11.

In this manner, the electron beam B is deflected by the secondary deflector 28 and the main deflector 29, and the shot position of the electron beam B is determined while the electron beam B follows the continuously moving the stage 11. The drawing time may be shortened by moving the stage 11 continuously in the X direction and controlling the shot position of the electron beam B to follow the movement of the stage 11. Although the stage 11 is continuously moved in the X direction in the first embodiment, without being limited to this, the step-and-repeat drawing method may be adopted in which drawing on one sub area is performed with the stage 11 stopped and drawing on the next sub area is not performed while the stage 11 is moved to the next sub area.

In this type of drawing using the electron beam B, the information on the position of the stage 11 measured by the stage position measurement unit 13 is used not only for control (feedback control) over the movement of the stage 11, but also for control over the secondary deflector 28 and the main deflector 29, that is, control over the shot position (control over drawing). For this reason, the measurement accuracy of the stage position measurement unit 13 significantly affects the drawing accuracy.

Next, the stage movement mechanism 12 and the stage position measurement unit 13 are described in detail.

Figure 2:
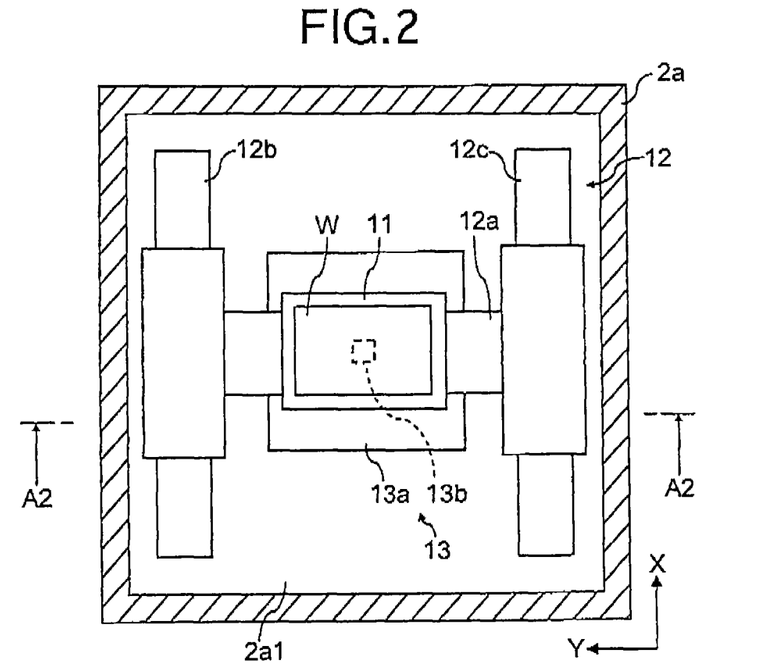
FIG. 2 is a transverse cross-sectional view (cross-sectional view taken along line A1-A1 of FIG. 1) illustrating a schematic configuration of a drawing chamber, a stage movement mechanism, and a stage position measurement unit according to the first embodiment.
Figure 3:
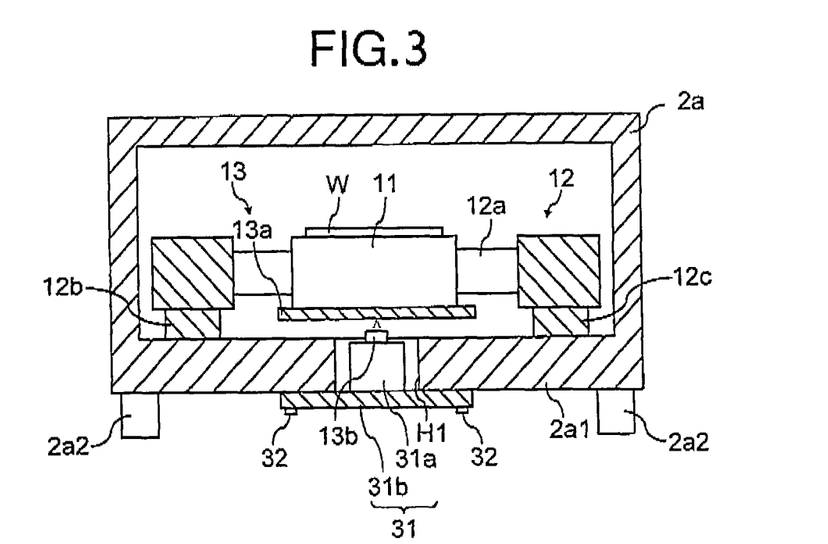
FIG. 3 is a longitudinal cross-sectional view (cross-sectional view taken along line A2-A2 of FIG. 2) illustrating a schematic configuration of the drawing chamber, the stage movement mechanism, and the stage position measurement unit according to the first embodiment.

As illustrated in FIGS. 2 and 3, the stage movement mechanism 12 includes a Y-direction movement mechanism 12a that moves the stage 11 in the Y direction, and a pair of X-direction movement mechanisms 12b and 12c that moves the Y-direction movement mechanism 12a in the X direction.

The Y-direction movement mechanism 12a is a mechanism that supports the stage 11 and guides and moves the stage 11 in the Y direction. The pair of X-direction movement mechanisms 12b and 12c is a mechanism that supports the Y-direction movement mechanism 12a and guides and moves the Y-direction movement mechanism 12a along with the stage 11 in the X direction. As the movement mechanisms 12a to 12c, various movement mechanisms may be used, for example, a linear motor type movement mechanism using a linear motor as a drive source, and a feed screw type movement mechanism using a servo motor as a drive source.

Another configuration of the stage movement mechanism 12 may be adopted in which X-direction movement mechanism that moves the stage 11 in the X direction, and a pair of Y-direction movement mechanisms that moves the X-direction movement mechanism in the Y direction are used.

The stage position measurement unit 13 includes the two-dimensional scale 13a provided on the lower surface of the stage 11, and the encoder head 13b that functions as a detector that detects graduations of the two-dimensional scale 13a.

The two-dimensional scale 13a has lattice-shaped graduations (for example, gratings) in the X direction and the Y direction. The graduations are detectable by the encoder head 13b and are spaced at regular intervals in the X direction and the Y direction. Any of various types of two-dimensional scales may be used as the two-dimensional scale 13a. It is to be noted that the two-dimensional scale 13a is a scale that has graduations in at least two directions (for example, the X direction and the Y direction).

The encoder head 13b is a reflective laser sensor that emits a laser beam to the two-dimensional scale 13a and receives a laser beam reflected by the two-dimensional scale 13a. The encoder head 13b measures a length by counting graduations of the two-dimensional scale 13a, that is, detects the position of the stage 11 by the two-dimensional scale 13a. In addition to reflective laser sensors, any of various types of encoder heads that are capable of detecting corresponding graduations of the two-dimensional scale 13a may be used as the encoder head 13b.

It is to be noted that the number of encoder heads 13b is not particularly limited, and for example, 2, 3 or more encoder heads 13b are preferably provided. When 3 or more encoder heads 13b are provided, a rotation (yaw) direction is detectable in addition to the X direction and the Y direction.

As illustrated in FIG. 3, the above-described encoder head 13b is provided on a lid body 31. The lid body 31 is S provided on the lower surface of a base plate 2a1 of the drawing chamber 2a with a hermetic seal member (not illustrated) such as an O ring interposed in between so as to close an opening H1 which is a through hole formed in the base plate 2a1. The lid body 31 is fixed by plural fixing members 32 such as bolts. It is to be noted that the four corners of the base plate 2a1 are each provided with a leg 2a2.

The lid body 31 includes a base 31a and a support plate 31b, and the encoder head 13b is provided on the upper surface of the base 31a which is fixed to the upper surface of the support plate 31b. The support body 31 functions as a support body that determines a height position of the encoder head 13b by adjusting the height of the base 31a and that positions and supports the encoder head 13b below the two-dimensional scale 13a.

The lid body 31 is detachable by mounting or removing the fixing members 32, thereby providing a structure to allow the opening H1 to be closed or opened. The lid body 31 is removed along with the encoder head 13b by a maintenance worker at the time of maintenance such as replacement (for example, replacement due to a failure or life expiry) of the encoder head 13b, and maintenance work for the encoder head 13b over the lid body 31 is performed.

For example, in the case where maintenance work for the encoder head 13b is performed above the drawing chamber 2a, the stage 11 and the stage movement mechanism 12 may interfere with the maintenance work. However, the lid body 31 is provided on the lower surface of the drawing chamber 2a, and the encoder head 13b is provided on the lid body 31, and thus the encoder head 13b may be removed along with the lid body 31, thereby enabling easy maintenance of the encoder head 13b. In this manner, maintenance performance (maintainability) may be improved.

Next, a vacuum state (decompressed state) of the aforementioned charged particle beam drawing apparatus 1 is described. Before start of drawing, the inside of the drawing chamber 2a and the optical lens barrel 2b is decompressed to a predetermined degree of vacuum, and a vacuum state is created, and subsequently, drawing using a charged particle beam is performed. At this point, the inside of both the drawing chamber 2a and the optical lens barrel 2b is in a vacuum state, and the drawing chamber 2a is deformed by the atmospheric pressure (pressure difference). However, since the base plate 2a1 of the drawing chamber 2a supports the stage 11 and the stage movement mechanism 12, the base plate 2a1 is formed to be thicker than the side wall of the drawing chamber 2a, and thus has high stiffness.

For this reason, when a vacuum is created inside the drawing chamber 2a, the side wall of the drawing chamber 2a is deformed. For example, the side wall is deformed so as to bend finely (for example, several tens to several hundreds μm) outward or inward. At this point, the base plate 2a1 of the drawing chamber 2a is thick and has high stiffness, and thus is not deformed and the lid body 31 provided on the base plate 2a1 is not inclined. Even when the lid body 31 is inclined, the degree of the inclination is not sufficient to decrease the accuracy of measurement of the stage position.

Therefore, even when a vacuum state is created in the drawing chamber 2a, the lid body 31 is not inclined due to deformation of the side wall of the drawing chamber 2a, and thus the position of the encoder head 13b on the lid body 31 is not moved relative to the two-dimensional scale 13a. Thus, occurrence of error in the measurement of the encoder head 13b is avoidable and reduction in accuracy of the measurement of the stage position is avoidable. It is to be noted that when the vacuum state of the drawing chamber 2a and the optical lens barrel 2b is released, the drawing chamber 2a and the optical lens barrel 2b return to the original forms.

As described above, according to the first embodiment, the encoder head 13b is provided on the lid body 31 located on the base plate 2a1 of the drawing chamber 2a, and thus even when the drawing chamber 2a is in a vacuum state, the lid body 31 is not inclined due to deformation of the side wall of drawing chamber 2a, and consequently, the position of the encoder head 13b is not moved relative to the two-dimensional scale 13a. Thus, even when the drawing chamber 2a is in a vacuum state, occurrence of error in the measurement of the encoder head 13b is avoidable and reduction in accuracy of the measurement of the stage position is avoidable.

In addition, by providing the encoder head 13b on the lid body 31, the encoder head 13b may be removed along with the lid body 31, thereby enabling easy maintenance of the encoder head 13b and maintenance performance may be improved.

(Second Embodiment)

A second embodiment is described with reference to FIG. 4. In the second embodiment, the difference (the support structure for encoder head) from the first embodiment is described, and other description is omitted. It is to be noted that the same components are denoted by the same symbol.

Figure 4:
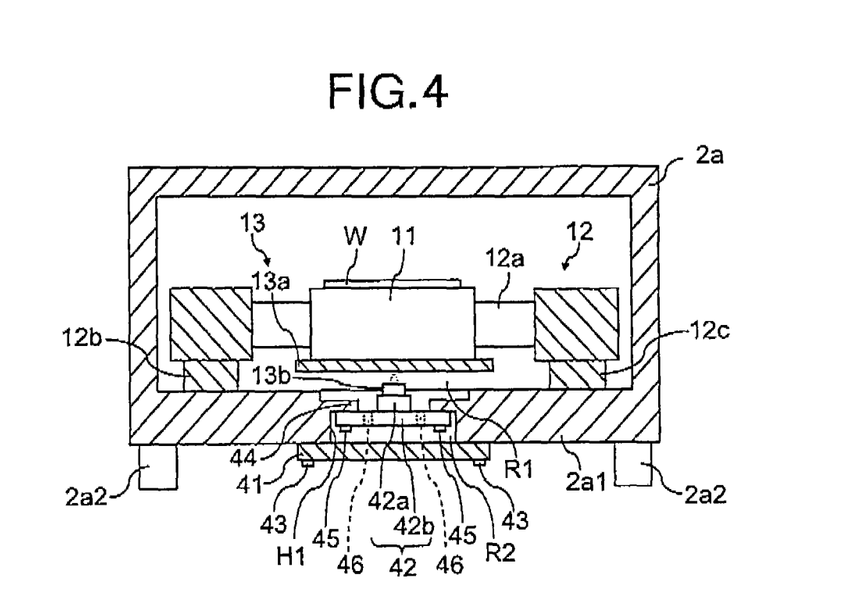
FIG. 4 is a longitudinal cross-sectional view illustrating a schematic configuration of a drawing chamber, a stage movement mechanism, and a stage position measurement unit according to a second embodiment.

As illustrated in FIG. 4, in the second embodiment, the opening H1 of the drawing chamber 2a is closed by a lid body 41 which is provided on the outer surface of the base plate 2a1 of the drawing chamber 2a. Also, a support body 42 that supports the encoder head 13b is provided spaced away from the lid body 41 in the opening H1.

The lid body 41 is formed in a plate shape and is provided on the lower surface of the base plate 2a1 via a hermetic seal member (not illustrated) such as an O ring so as to close the opening H1 of the drawing chamber 2a. The lid body 41 is fixed by plural fixing members 43 such as bolts. The lid body 41 is detachable by mounting or removing the fixing members 43, thereby providing a structure to allow the opening H1 to be closed or opened.

The support body 42 is provided in the opening H1 located below the stage 11 and supports the encoder head 13b. The support body 42 includes a base 42a and a support plate 42b, and the encoder head 13b is provided on the upper surface of the base 42a which is fixed to the upper surface of the support plate 42b. The support body 42 functions as a support body that determines a height position of the encoder head 13b by adjusting the height of the base 42a and that positions and supports the encoder head 13b below the two-dimensional scale 13a.

It is to be noted that an annular mounting portion 44 extending inwardly of the opening H1 is formed near the upper end of the opening H1, and the support plate 42b of the support body 42 is fixed to the lower surface of the mounting portion 44 by plural fixing members 45 such as bolts. The mounting portions 44 are part of the inner wall of the opening H1. The support plate 42b is detachable by mounting or removing the fixing members 45.

The support body 42 is a support member that supports the encoder head 13b, and divides (partitions) the internal space of the drawing chamber 2a into a first space R1 and a second space R2. The support plate 42b of the support body 42 has plural through holes 46 via which the first space H1 and the second space R2 communicate with each other. The encoder head. 13b is provided. on the support plate 42b so as not to close the through holes 46. Thus, the first space R1 and the second space R2 communicate with each other and have the same pressure.

It is to be noted that the number of the above-described through holes 46 is not limited to a particular number, and so may be one, for example. Also, a communicating portion via which the first space R1 and the second space R2 communicate with each other is not limited to the through holes 46, and for an example, the support plate 42b may be provided so that a gap (gap portion) having a predetermined distance is formed between the mounting portion 44 and the support plate 42b. As an example, when the support plate 42b is fixed to the mounting portion 44 by the fixing members 45 such as bolts, it is possible to form a gap by providing a member such as a washer between the mounting portion 44 and the support plate 42b. It is also possible to form a gap therebetween by fixing a rectangular support plate 42b to the annular mounting portion 44, the rectangular support plate 42b having a width smaller than the opening diameter of the annular mounting portion 44.

The lid body 41 and the support body 42 are removed by a maintenance worker at the time of maintenance such as replacement of the encoder head 13b, and maintenance work for the encoder head 13b over the lid body 41 is performed. For example, in the case where maintenance work for the encoder head 13b is performed above the drawing chamber 2a, the stage 11 and the stage movement mechanism 12 may interfere with the maintenance work. However, by providing the lid body 41 on the lower surface of the drawing chamber 2a, and further providing the encoder head 13b on the support body 42 located over the lid body 41, the encoder head 13b may be removed along with the lid body 41 and the support body 42, thereby enabling easy maintenance of the encoder head 13b. In this manner, maintenance performance may be improved.

Next, a vacuum state (decompressed state) of the aforementioned charged particle beam drawing apparatus 1 is described.

Before start of drawing, the inside of the drawing chamber 2a and the optical lens barrel 2b is decompressed to a predetermined degree of vacuum, and a vacuum state is created, and subsequently, drawing using a charged particle beam is performed. At this point, the first space R1 and the second space R2 in the drawing chamber 2a are in a vacuum state. In the vacuum state, similarly to the first embodiment, the base plate 2a1 of the drawing chamber 2a is not deformed but the side wall is deformed. In addition, the lid body 41 located below the lower surface of the base plate 2a1 is curved and deformed inward of the drawing chamber 2a due to the atmospheric pressure (pressure difference). When the vacuum state is released, the lid body 41 and the side wall return to its original form.

When the drawing chamber 2a is in a vacuum state, the lid body 41 is deformed due to the atmospheric pressure. However, since the first space R1 and the second space R2 communicate with each other via the through holes 46 of the support body 42, the support body 42 that supports the encoder head 13b, that is, the base 42a and the support plate 42b are not deformed due to the atmospheric pressure. Therefore, the position of the encoder head 13b is not moved relative to the two-dimensional scale 13a, and occurrence of error in the measurement of the encoder head 13b is avoidable and reduction in accuracy of the measurement of the stage position is avoidable. In addition, even when the lid body 41 is in a thin plate shape and has low stiffness, deformation of the lid body 41 does not cause a problem as described above, and thus the lid body 41 may be formed in a thin plate shape and cost reduction and reduction of apparatus weight may be achieved.

As described above, according to the second embodiment, the through holes 46 are provided in the support body 42 that supports the encoder head 13b, and thus when the drawing chamber 2a is in a vacuum state, the atmospheric pressure is not applied to the support body 42 and the same pressure is applied to the upper surface and the lower surface of the support body 42. As a result, even when the lid body 41 is deformed by the atmospheric pressure, the support body 42 is not deformed. Consequently, even when the drawing chamber 2a is in a vacuum state, the position of the encoder head 13b is not moved relative to the two-dimensional scale 13a, and occurrence of error in the measurement of the encoder head 13b is avoidable, and thus reduction in accuracy of the measurement of the stage position is avoidable.

In addition, by providing the encoder head 13b on the support body 42 located over the lid body 41, the encoder head 13b may be removed along with the support body 42 after the lid body 41 is removed, thereby enabling easy maintenance of the encoder head 13b, and thus maintenance performance may be improved.

(Third Embodiment)

A third embodiment is described with reference to FIGS. 5 and 6.

In the third embodiment, the difference (drawing chamber and the support structure for encoder head) from the second embodiment is described, and other description is omitted. It is to be noted that the same components are denoted by the same symbol.

Figure 5:
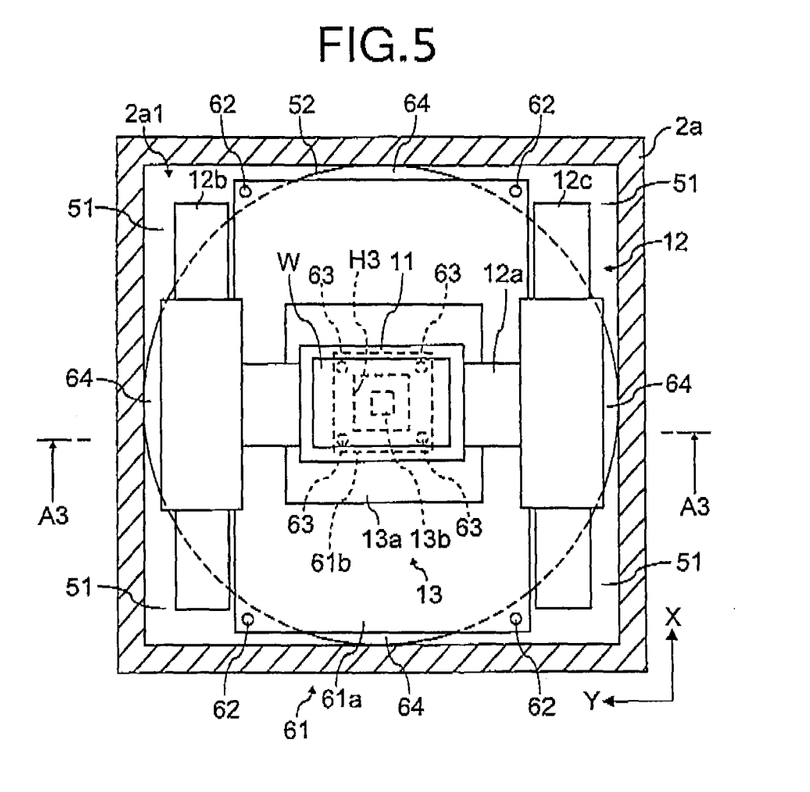
FIG. 5 is a transverse cross-sectional view illustrating a schematic configuration of a drawing chamber, a stage movement mechanism, and a stage position measurement unit according to a third embodiment.
Figure 6:
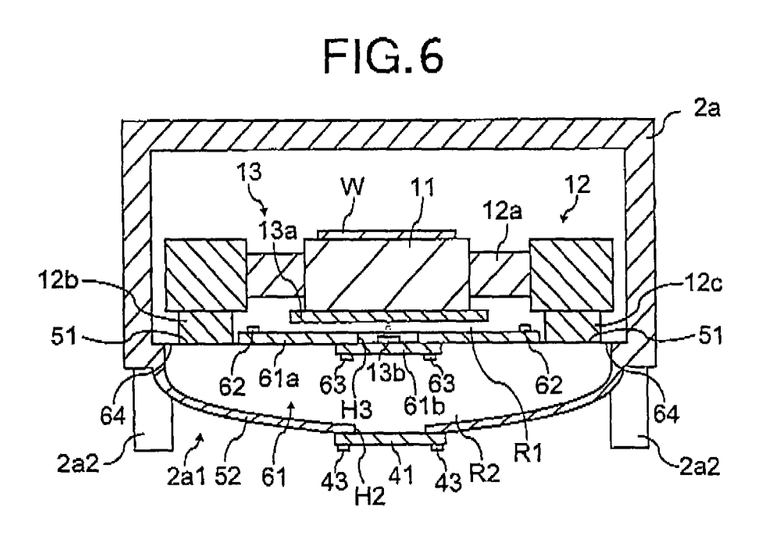
FIG. 6 is a longitudinal cross-sectional view (cross-sectional view taken along line A3-A3 of FIG. 5) illustrating a schematic configuration of the drawing chamber, the stage movement mechanism, and the stage position measurement unit according to the third embodiment.

As illustrated in FIGS. 5 and 6, in the third embodiment, the base plate 2a1 of the drawing chamber 2a includes plural supports 51 that support the stage 11 and the stage movement mechanism 12, and a convex-shaped curved part 52 that is curved and projects outwardly of the drawing chamber 2a. The supports 51 and the curved part 52 are formed integrally with the side wall of the drawing chamber 2a.

The supports 51 are provided in respective four corners of drawing chamber 2a, that is, four corners of the base plate 2a1, separately, and form part of the base plate 2a1. Each of the upper surfaces of the supports 51, that is, individual support side is placed on a corresponding one of ends of a pair of X-direction movement mechanisms 12b and 12c, and so the X-direction movement mechanisms 12b and 12e are provided on the supports 51.

The curved part 52 is disposed in the middle of the base plate 2a1 and connected to each support 51, and along with the supports 51, form the base plate 2a1. The curved part 52 is formed in a cup shape (hollow hemispherical shape) which is curved outwardly of the drawing chamber 2a, that is, curved in the direction opposite to the stage 11 inside the chamber. That is, the curved part 52 has a curved surface that continues to the each support side of the supports 51.

For example, the curved part 52 has a uniform thickness which is thinner than the thickness of the supports 51. The diameter of the curved part 52 in plan view is the same as the longitudinal and transverse length of the square base plate 2a1. The degree of curve (curvature) of the curved part 52 is determined based on the thickness of the curved part 52 and the thickness of the side wall of the drawing chamber 2a so that the supports 51 are not deformed when the drawing chamber 2a is in a vacuum state.

The curved part 52 has an opening H2 that is a through hole located below the encoder head 13b. Similarly to the second embodiment, the opening H2 is closed by the lid body 41. The lid body 41 is formed in a plate shape and is provided on the lower surface of the drawing chamber 2a via a hermetic seal member (not illustrated) such as an O ring. The lid body 41 is fixed by plural fixing members 43 such as bolts. The lid body 41 is detachable by mounting or removing the fixing members 43, thereby providing a structure to allow the opening H2 to be closed or opened.

A support body 61 includes a support plate 61a having a through hole H3, and a support plate 61b that positions and supports the encoder head 13b in the through hole H3. The support plate 61a is formed in a rectangular shape such as a rectangle, and is provided on the upper surfaces of the supports 51 of the base plates 2a1 so as to straddle and cover the curved part 52 of the base plate 2a1. The support plate 61a is fixed by plural fixing members 62 such as bolts. The support plate 61b also supports the encoder head 13b, is provided on the lower surface of the support plate 61a with the encoder head 13b positioned in the through hole H3 of the support plate 61a, and is fixed by plural fixing members 63 such as bolts. The support plate 61a or 61b is detachable by mounting or removing the fixing members 62 or 63.

The support body 61 is a support member that supports the encoder head 13b, and divides the internal space of the drawing chamber 2a into a first space R1 and a second space R2. Since the support body 61 is provided to straddle the curved part 52 of the base plate 2a, plural gap portions 64 are formed between the support plate 61a of the support body 61 and each support 51 of the base plate 2a1, whereby the first space R1 and the second space R2 communicate with each other via the gap portions 64. Thus, the first space R1 and the second space R2 communicate with each other and have the same pressure.

The lid body 41 and the support plate 61b of the support body 61 are removed by a maintenance worker at the time of maintenance such as replacement of the encoder head 13b, and maintenance work for the encoder head 13b on the support plate 61b is performed. For example, in the case where maintenance work for the encoder head 13b is performed above the drawing chamber 2a, the stage 11 and the stage movement mechanism 12 may interfere with the maintenance work. However, by providing the lid body 41 on the lower surface of the drawing chamber 2a, and further providing the encoder head 13b on the support plate 61b located over the lid body 41, the encoder head 13b may be removed along with the lid body 41 and the support plate 61b, thereby enabling easy maintenance of the encoder head 13b. In this manner, maintenance performance may be improved.

When the above-described drawing chamber 2a is in a vacuum state, the lid body 41 and the curved part 52 of the base plate 2a1 are deformed due to the atmospheric pressure. However, since the first space R1 and the second space R2 communicate with each other via the gap portions 64, the support body 61 that supports the encoder head 13b, that is, the support plates 61a and 61b are not deformed due to the atmospheric pressure. Therefore, the position of the encoder head 13b is not moved relative to the two-dimensional scale 13a, and occurrence of error in the measurement of the encoder head 13b is avoidable and reduction in accuracy of the measurement of the stage position is avoidable.

When the drawing chamber 2a is in a vacuum state, the curved part 52 of the base plate 2a1 is deformed, for example, inward of the chamber due to the atmospheric pressure. At this point, a force, which pushes out the curved part 52 in the outer radial direction of the chamber, is applied to each support 51 and tries to restore the inclination (inclination due to the atmospheric pressure) of each support side of the supports 51 to original state. That is, because of the curved structure of the curved part 52, deformation of each support 51 caused by the force pushing out the curved part 52 may cancel deformation of each support 51 caused by the atmospheric pressure. Thus, by applying curved structure to the base plate 2a1, deformation of each support 51 is suppressed, and it is possible to avoid inclination of the upper surface of each support 51, that is, the support side. Therefore, the support body 61 on each support 51 is not inclined, and thus the position of the encoder head. 13b on the lid body 31 is not moved relative to the two-dimensional scale 13a.

In addition, even when the base plate 2a1, that is, the curved part 52 is in a thin plate shape and has low stiffness, deformation of the curved part 52 suppresses deformation of each support 51 and does not cause a problem as described above. For this reason, the thickness of the base plate 2a1 does not have to be increased to avoid deformation of the base plate 2a1, and the base plate 2a1 may be formed in a thin plate shape, and thus cost reduction and reduction of apparatus weight may be achieved.

As described above, according to the third embodiment, it is possible to obtain the same effect as in the second embodiment, and reduction in accuracy of the measurement of the stage position is avoidable. In addition, after the lid body 41 is removed, the encoder head 13b may be removed along with the support plate 61b, thereby enabling easy maintenance of the encoder head 13b and maintenance performance may be improved.

(Fourth Embodiment)

A fourth embodiment is described with reference to FIGS. 7 and 8. In the fourth embodiment, the difference (the support structure for encoder head) from the third embodiment is described, and other description is omitted. It is to be noted that the same components are denoted by the same symbol.

Figure 7:
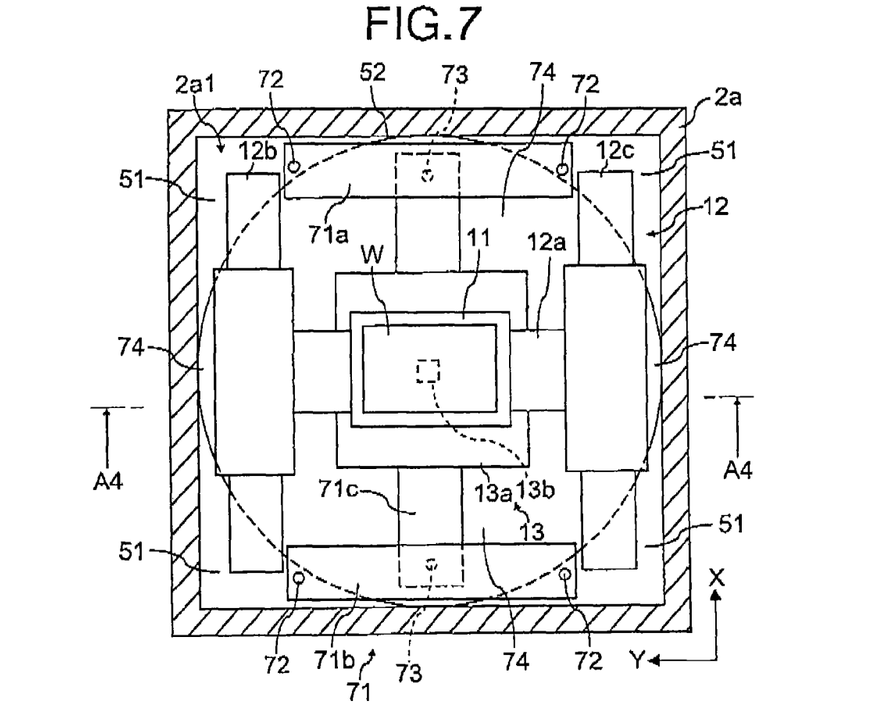
FIG. 7 is a transverse cross-sectional view illustrating a schematic configuration of a drawing chamber, a stage movement mechanism, and a stage position measurement unit according to a fourth embodiment.
Figure 8:
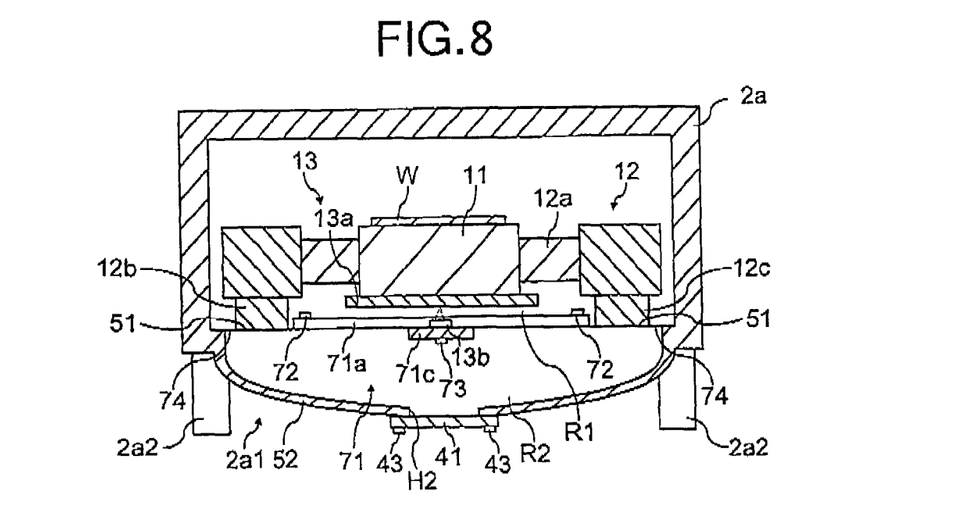
FIG. 8 is a longitudinal cross-sectional view (cross-sectional view taken along line A4-A4 of FIG. 7) illustrating a schematic configuration of the drawing chamber, the stage movement mechanism, and the stage position measurement unit according to the fourth embodiment.

As illustrated in FIGS. 7 and 8, in the fourth embodiment, a support body 71 includes a pair of support plates 71a and 71b, and a support plate 71c that supports the encoder head 13b.

The pair of support plates 71a and 71b is formed in a rectangular shape, and is provided on the upper surfaced of the supports 51 so as to straddle the curved part 52 of the base plate 2a1 in the Y direction. The support plates 71a and 71b are each fixed by plural fixing members 72 such as bolts. The pair of support plates 71a and 71b are separately positioned on both end sides of the base plate 2a. The support plates 71a and 71b are each detachable by mounting or removing the fixing members 72. Similarly to the above-described support plates 71a and 71b, the support plate 71c is formed in a rectangular shape such as a rectangle. The support plate 71c bridges between the support plates 71a and 71b so as to straddle the curved part 52 of the base plate 2a1 in the X direction, and is provided on the lower surface of the support plates 71a and 71b. The support plate 71c is fixed by plural fixing members 73 such as bolts. It is to be noted that the support plate 71c is positioned to pass through the middle of the base plate 2a1. The support plate 71c is detachable by mounting or removing the fixing members 73.

The support body 71 is a support member that supports the encoder head. 13b, and divides the internal space of the drawing chamber 2a into a first space R1 and a second space R2. Since the support body 71 is provided to straddle the curved part 52 of the base plate 2a1, plural gap portions 74 are formed between the support body 71 and each support 51 of the base plate 2a1, where the first space R1 and the second space R2 communicate with each other via the gap portions 74. Thus, the first space R1 and the second space R2 communicate with each other and have the same pressure.

The lid body 41 and the support plate 71c of the support body 71 are removed by a maintenance worker at the time of maintenance such as replacement of the encoder head 13b, and maintenance work for the encoder head 13b on the support plate 71c is performed. For example, in the case where maintenance work or the encoder head 13b is performed above the drawing chamber 2a, the stage 11 and the stage movement mechanism 12 may interfere with the maintenance work. However, by providing the lid body 41 on the lower surface of the drawing chamber 2a, and further providing the encoder head 13b on the support plate 71c located over the lid body 41, the encoder head. 13b may be removed along with the lid body 41 and the support plate 71c, thereby enabling easy maintenance of the encoder head 13b. In this manner, maintenance performance may be improved.

When the above-described drawing chamber 2a is in a vacuum state, the lid body 41 and the curved part 52 of the base plate 2a1 are deformed due to the atmospheric pressure. However, as similarly to the third embodiment, since the first space R1 and the second space R2 communicate with each other via the gap portions 74, the support body 71 that supports the encoder head 13b, that is, the pair of support plates 71a and 71b and the support plate 71 are not deformed due to the atmospheric pressure. Therefore, the position of the encoder head 13b is not moved relative to the two-dimensional scale 13a, and occurrence of error in the measurement of the encoder head. 13b is avoidable and reduction in accuracy of the measurement of the stage position is avoidable.

In addition, even when the base plate 2a1, that is, the curved part 52 is in a thin plate shape and has low stiffness, similarly to the third embodiment, deformation of the curved part 52 suppresses deformation of each support 51 and does not cause a problem. For this reason, the thickness of the base plate 2a1 does not have to be increased to avoid deformation of the base plate 2a1, and the base plate 2a1 may be formed in a thin plate shape, and thus cost reduction and reduction of apparatus weight may be achieved.

As described above, according to the fourth embodiment, it is possible to obtain the same effect as in the third embodiment, and reduction in accuracy of the measurement of the stage position is avoidable. In addition, after the lid body 41 is removed, the encoder head 13b may be removed, along with the support plate 71c, thereby enabling easy maintenance of the encoder head 13b and maintenance performance may be improved.

(Other Embodiment)

In the above-described first to fourth embodiments, as the two-dimensional scale 13a, a scale having lattice-shaped graduations in the X direction and the Y direction is used. However, without being limited to this, a scale having graduations in a direction other than the X direction and the Y direction may be used as long as the scale has graduations in at least 2 directions, for example.

In the third embodiment described above, the curved part 52 is not completely covered by the support body 61 and the gap portions 64 are provided as communicating portions. However, without being limited to this, for example, the curved part 52 may be completely covered by the support body 61 which may be provided with a through hole as a communicating portion. Although the plate-shaped support plates 61a and 61b are used as the support body 61, without being limited to this, for example, a support member other than a plate-shaped member may be used.

In the fourth embodiment described above, the support plate 71c of the support body 71 is provided to straddle the curved part 52 in the X direction. However, without being limited to this, the support plate 71c of the support body 71 may be provided to straddle the curved part 52 in another direction, for example, in a slanting direction with respect to the X direction. Although the plate-shaped support plates 71a and 71b are used as the support body 71, without being limited to this, for example, a support member other than a plate-shaped member may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charged particle beam drawing apparatus comprising:
a vacuum vessel including a base plate;
a stage provided in the vacuum vessel and supporting a sample;
a stage movement mechanism provided in the vacuum vessel and moving the stage;

a two-dimensional scale provided on a lower surface of the stage;

a detection unit disposed under the two-dimensional scale and detecting a position of the stage by using the two-dimensional scale;

a support body supporting the detection unit;

an opening provided on the base plate;

a lid body that is provided with the base plate and closes the opening; and a gap that communicates with an upper area and a lower area, wherein the support body is disposed between the lid body and the detection unit so as to be spaced away from the lid body.

2. The charged particle beam drawing apparatus according to claim 1, wherein the support body is detachable.

3. The charged particle beam drawing apparatus according to claim 1, wherein the lid body is detachable.

4. The charged particle beam drawing apparatus according to claim 1, wherein the opening is further provided with a mounting portion for installing the support body.

5. The charged particle beam drawing apparatus according to claim 1, wherein the support body has a first through hole.

6. The charged particle beam drawing apparatus according to claim 1, wherein at least part of the support body is spaced away from an inner wall of the opening.

7. The charged particle beam drawing apparatus according to claim 1, wherein the base plate includes a plurality of supports that support the stage movement mechanism, and a curved part that is curved outwardly of the vacuum vessel, both ends of the support body are disposed on the plurality of supports in such a way that the support body straddles the curved part.

8. The charged particle beam drawing apparatus according to claim 7, wherein the support body includes:

a first support plate including a second through hole, and both ends of the first support plate disposed on the supports in such a way that the first support plate straddles the curved part; and a second support plate mounted on the first support plate in such a way as to close at least part of the second through hole and the second support supporting the detection unit.

9. The charged particle beam drawing apparatus according to claim 7, wherein the support body includes:

a pair of third support plates each of which has both ends disposed on the supports in such a way that the third support plate straddles the curved part, and a fourth support plate mounted on the pair of third support plates in such a way as to bridge between the third support plates, and the fourth support plate supporting the detection unit.

10. The charged particle beam drawing apparatus according to claim 7, wherein the curved part has a thickness less than a thickness of each of the supports.

11. The charged particle beam drawing apparatus according to claim 1, wherein the base plate has an opening in the curved part, and further includes a lid body that closes the opening.

12. The charged particle beam drawing apparatus according to claim 11, wherein the lid body is detachable.

* * * * *